(12) United States Patent
Li

(10) Patent No.: US 7,794,546 B2
(45) Date of Patent: *Sep. 14, 2010

(54) SEALING DEVICE AND METHOD FOR A PROCESSING SYSTEM

(75) Inventor: Yicheng Li, Kai (JP)

(73) Assignee: Tokyo Electron Limited, Tokyo (JP)

( * ) Notice: Subject to any disclaimer, the term of this patent is extended or adjusted under 35 U.S.C. 154(b) by 746 days.

This patent is subject to a terminal disclaimer.

(21) Appl. No.: 11/369,939

(22) Filed: Mar. 8, 2006

(65) Prior Publication Data

US 2007/0209590 A1     Sep. 13, 2007

(51) Int. Cl.
*C23C 16/458* (2006.01)
*C23F 1/00* (2006.01)
*H01L 21/306* (2006.01)
*C23C 16/06* (2006.01)
*C23C 16/22* (2006.01)

(52) U.S. Cl. .................. 118/733; 118/728; 118/729; 118/719; 156/345.22; 156/345.31

(58) Field of Classification Search ............ 118/733, 118/728, 729, 719; 156/345.22, 345.31
See application file for complete search history.

(56) References Cited

U.S. PATENT DOCUMENTS

| | | | |
|---|---|---|---|
| 4,047,496 A | 9/1977 | McNeilly et al. | |
| 4,778,559 A | 10/1988 | McNeilly | |
| 5,133,561 A | 7/1992 | Hattori et al. | |
| 5,223,001 A | 6/1993 | Saeki | |
| 5,571,366 A | 11/1996 | Ishii et al. | |
| 5,772,833 A | 6/1998 | Inazawa et al. | |
| 5,883,017 A * | 3/1999 | Tepman et al. | 438/800 |
| 6,477,980 B1 * | 11/2002 | White et al. | 118/723 E |
| 6,852,167 B2 | 2/2005 | Ahn | |
| 2003/0230322 A1 | 12/2003 | Hillman et al. | |
| 2005/0136657 A1 | 6/2005 | Yokoi et al. | |
| 2005/0284370 A1 | 12/2005 | Strang | |
| 2006/0027167 A1 | 2/2006 | Ishizaka et al. | |
| 2006/0213439 A1 * | 9/2006 | Ishizaka | 118/715 |
| 2006/0234514 A1 | 10/2006 | Gianoulakis et al. | |

* cited by examiner

*Primary Examiner*—Rudy Zervigon
(74) *Attorney, Agent, or Firm*—Oblon, Spivak, McClelland, Maier & Neustadt, L.L.P.

(57) ABSTRACT

A method, computer readable medium, and system for treating a substrate in a process space of a processing system that is vacuum isolated from a transfer space of the processing system is described. A sealing device is disposed between a first chamber assembly configured to define the process space and a second chamber assembly configured to define the transfer space. When the sealing device is engaged, vacuum isolation is provided between the process space and the transfer space. The sealing device comprises two or more contact ridges with one or more pockets formed therebetween. When the sealing device is engaged between the first chamber assembly and the second chamber assembly, gas is trapped in the one or more pockets. This trapped gas assists the release of the sealing device upon disengagement of the sealing device between the first chamber assembly and the second chamber assembly.

24 Claims, 8 Drawing Sheets

SEALING DEVICE AND METHOD FOR A PROCESSING SYSTEM

CROSS REFERENCE TO RELATED APPLICATIONS

This application is related to U.S patent application Ser. No. 11/090,255, Client Ref. No. TTCA-019, U.S. Pat. Appl. Publ. No. 2006/0213437, the entire contents of which are incorporated herein by reference. This application is related to pending U.S. patent application Ser. No. 11/084,176, U.S Pat. Appl. Publ. No. 2006/0111243, the entire contents of which are incorporated herein by reference. This application is related to pending U.S. patent application Ser. No. 11/090,939, Client Ref. No. TTCA-027, U.S. Pat. Appl. Publ. No. 2006/0213439, the entire contents of which are incorporated herein by reference. This application is related to pending U.S. patent application Ser. No. 11/281,343, Client Ref. No. TTCA-054, U.S. Pat. Appl. Publ. No. 2007/0116888, the entire contents of which are incorporated herein by reference. This application is related to pending U.S. patent application Ser. No. 11/281,342, Client Ref. No. TTCA-055, U.S. Pat. Appl. Publ. No. 2007/0116887, the entire contents of which are incorporated herein by reference. This application is related to U.S. patent application Ser. No. 11/305,036, Client Ref. No. TTCA-063, U.S. Pat. Appl. Publ. No. 207/0157683, the entire contents of which are incorporated herein by reference. This application is related to U.S. patent application Ser. No. 11/281,376, Client Ref. No. TTCA-056, U.S. Pat. Appl. Publ. No. 2007/0116873,the entire contents of which are incorporated herein by reference. This application is related to U.S. patent application Ser. No. 11/281,372, Client Ref. No. TTCA-069, U.S Pat. Appl. Publ. No. 207/0116872, the entire contents of which are incorporated herein by reference.

BACKGROUND OF THE INVENTION

1. Field of Invention

The present invention relates to a deposition system and a method of operating thereof, and more particularly to a deposition system having separate regions for material deposition and transfer and a sealing device for isolating the separate regions from one another.

2. Description of Related Art

Typically, during materials processing, when fabricating composite material structures, a plasma is frequently employed to facilitate the addition and removal of material films. For example, in semiconductor processing, a dry plasma etch process is often utilized to remove or etch material along fine lines or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, a plasma is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), and plasma enhanced ALD (PEALD) have emerged as a candidates for ultra-thin gate film formation in front end-of-line (FEOL) operations, as well as ultra-thin barrier layer and seed layer formation for metallization in back end-of-line (BEOL) operations. In ALD, two or more process gases, such as a film precursor and a reduction gas, are introduced alternatingly and sequentially while the substrate is heated in order to form a material film one monolayer at a time. In PEALD, plasma is formed during the introduction of the reduction gas to form a reduction plasma. To date, ALD and PEALD processes have proven to provide improved uniformity in layer thickness and conformality to features on which the layer is deposited, albeit these processes are slower than their CVD and PECVD counterparts.

SUMMARY OF THE INVENTION

One object of the present invention is directed to addressing various problems with semiconductor processing at ever decreasing line sizes where conformality, adhesion, and purity are becoming increasingly important issues affecting the resultant semiconductor device.

Another object of the present invention is to reduce contamination problems between interfaces of subsequently deposited or processed layers.

Another object of the present invention is to provide a configuration compatible for vapor deposition and sample transfer within the same system.

Variations of these and/or other objects of the present invention are provided by certain embodiments of the present invention.

In one embodiment of the present invention, a vacuum processing system for treating a substrate, comprises: a first chamber assembly comprising a first sealing surface, a second chamber assembly comprising a second sealing surface, and a sealing device coupled to and retained by one of said first sealing surface or said second sealing surface, said sealing device comprising two or more contact ridges and one or more pockets disposed therebetween, and a seal between said first chamber assembly and said second chamber assembly is formed by coupling said first chamber assembly to said second chamber assembly in order to facilitate contact of said two or more contact ridges of said sealing device with said second sealing surface while trapping gas between said two or more contact ridges within said pocket.

In another embodiment of the present invention, a method, and computer readable medium containing instructions, for vacuum sealing a first chamber assembly with a second chamber assembly in a vacuum processing system is described, comprising: disposing a sealing device on a first sealing surface on the first chamber assembly, wherein the sealing device comprises two or more contact ridges and one or more pockets disposed therebetween; and engaging the sealing device with a second sealing surface on the second chamber assembly by contacting the two or more contact ridges of the sealing device with the second sealing surface while trapping gas within the one or more pockets formed between the two or more contact ridges.

Another embodiment of the invention, provides a vacuum processing system for treating a substrate, including: a first chamber assembly comprising a first sealing surface; a second chamber assembly comprising a second sealing surface; and means for sealing said first chamber assembly to said second chamber assembly such that gas is trapped in said means for sealing when said second chamber assembly translates toward said first assembly and said gas trapped in said means for sealing is at a pressure higher than a pressure external to said means for sealing.

BRIEF DESCRIPTION OF THE DRAWINGS

In the accompanying drawings, a more complete appreciation of the present invention and many attendant advantages thereof will be readily obtained as the same becomes better understood by reference to the following detailed description when considered in connection with the accompanying drawings, wherein.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1A:
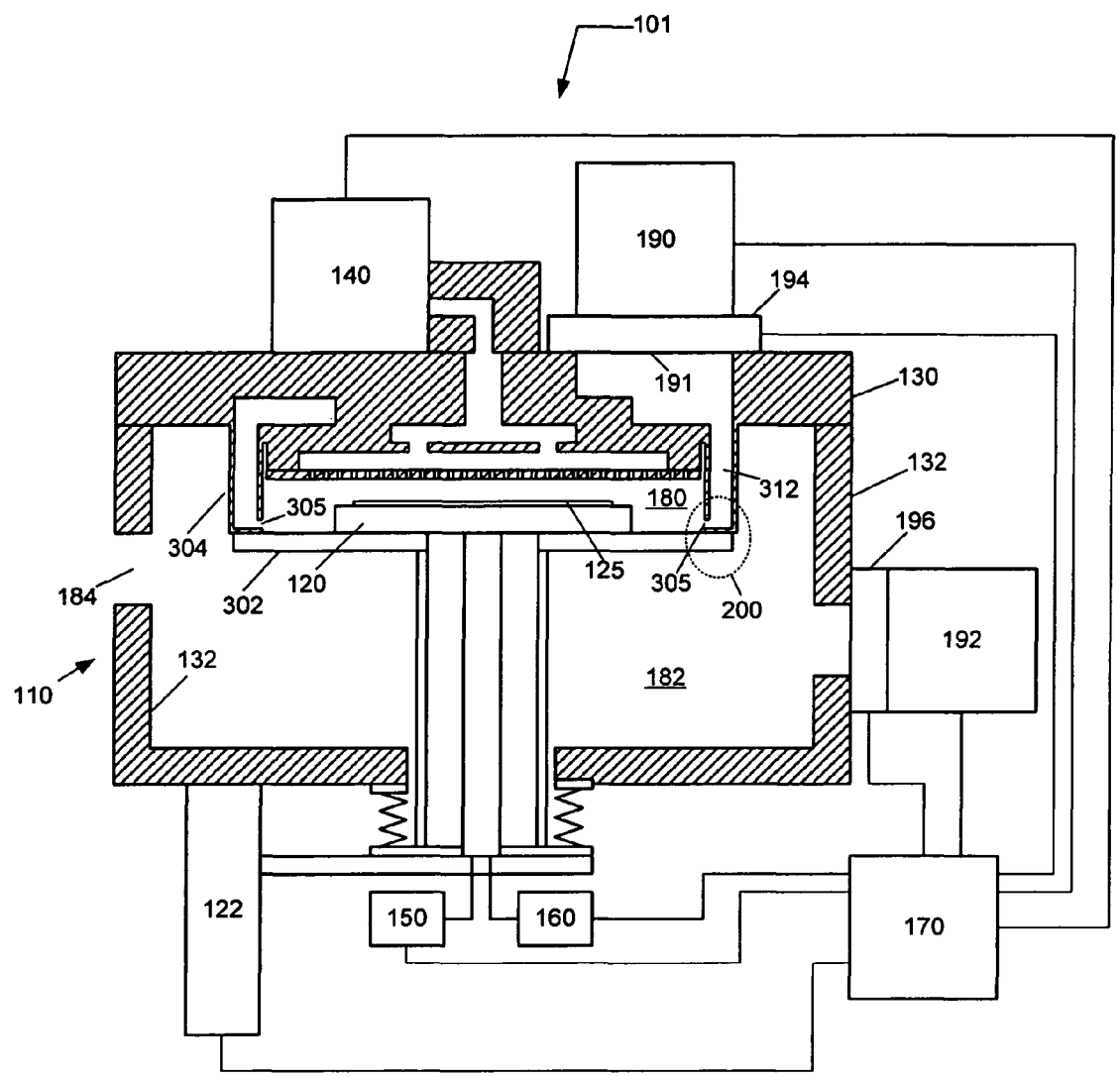
FIG. 1A depicts a schematic view of a deposition system in accordance with one embodiment of the present invention.

Referring now to the drawings, wherein like reference numerals designate identical or corresponding parts throughout the several views, FIG. 1A illustrates a deposition system 1 for depositing a thin film, such as a barrier film, on a substrate using for example a chemical vapor deposition (CVD) process, a plasma enhanced CVD (PECVD) process, an atomic layer deposition (ALD) process, or a plasma enhanced atomic layer deposition (PEALD) process. During the metallization of inter-connect and intra-connect structures for semiconductor devices in back-end-of-line (BEOL) operations, a thin conformal barrier layer may be deposited on wiring trenches or vias to minimize the migration of metal into the inter-level or intra-level dielectric, a thin conformal seed layer may be deposited on wiring trenches or vias to provide a film with acceptable adhesion properties for bulk metal fill, and/or a thin conformal adhesion layer may be deposited on wiring trenches or vias to provide a film with acceptable adhesion properties for metal seed deposition. In addition to these processes, a bulk metal such as copper must be deposited within the wiring trench or via.

As line sizes shrink, PEALD has emerged as a leading candidate for such thin films. For example, a thin barrier layer is preferably performed using a self-limiting ALD process, such as PEALD, since it provides acceptable conformality to complex, high aspect ratio features. In order to achieve a self-limiting deposition characteristic, a PEALD process involves alternating different process gases, such as a film precursor and a reduction gas, whereby the film precursor is adsorbed to the substrate surface in a first step and then reduced to form the desired film in a second step. Due to the alternation of two process gases in a vacuum chamber, deposition occurs at a relatively slow deposition rate.

The present inventors have recognized that a PEALD process, as well as a CVD process, can benefit by separating the process space within which the PEALD process is performed from a transfer space within which the substrate is transferred into and out of the processing chamber. The physical isolation of the process space and the transfer space reduces the contamination of processed substrates. Since CVD and ALD processes are know to be "dirtier" than other deposition techniques, such as physical vapor deposition (PVD), the physical isolation of the process space and the transfer space can further reduce the transport of contamination from the processing chamber to other processing chambers coupled to the central transfer system.

Thus, it is described in related applications (TTCA-027; U.S. patent application Ser. No. 11/090,939), (TTCA-056; U.S. patent application Ser. No. 11/281,376), and (TTCA-069; U.S. patent application Ser. No. 11/281,372) to separate a process space from a transfer space in order to reduce contamination of processed substrates; the entire contents of each of which are herein incorporated by reference in their entirety.

When physically separating the process space from the transfer space, a first vacuum pumping system and a second vacuum pumping system are used to separately pump the process space and the transfer space, respectively.

Further, the materials used for the CVD and ALD processes are increasingly more complex. For example, when depositing metal containing films, metal halide film precursors or metal-organic film precursors are utilized. As such, the processing chambers are often contaminated with precursor residue or partially decomposed precursor residue or both on walls of the deposition system.

One way to reduce film precursor residue on chamber surfaces is to increase a temperature of the surfaces in the processing chambers to a point where precursor accumulation cannot occur. However, the present inventors have recognized that such a high temperature chamber (especially when used with elastomer seals) can cause air and water vapor from outside of the (vacuum) processing chamber, and therefore contaminants, to permeate through the seals of the processing chamber. For example, while maintaining one chamber component at an elevated temperature with another chamber component at a lower temperature, the inventors have observed an increase in processing chamber contamination from outside of the chamber when the sealing member comprises elastomer seals used with conventional sealing schemes.

Hence, another aspect of the present invention is to physically separate the process space from the transfer space of the processing chamber during processing, and thereby maintain the process space surfaces at a relatively high temperature to reduce film precursor accumulation, while maintaining transfer space surfaces at a lower temperature to reduce contamination within the transfer space region.

Figure 1B:
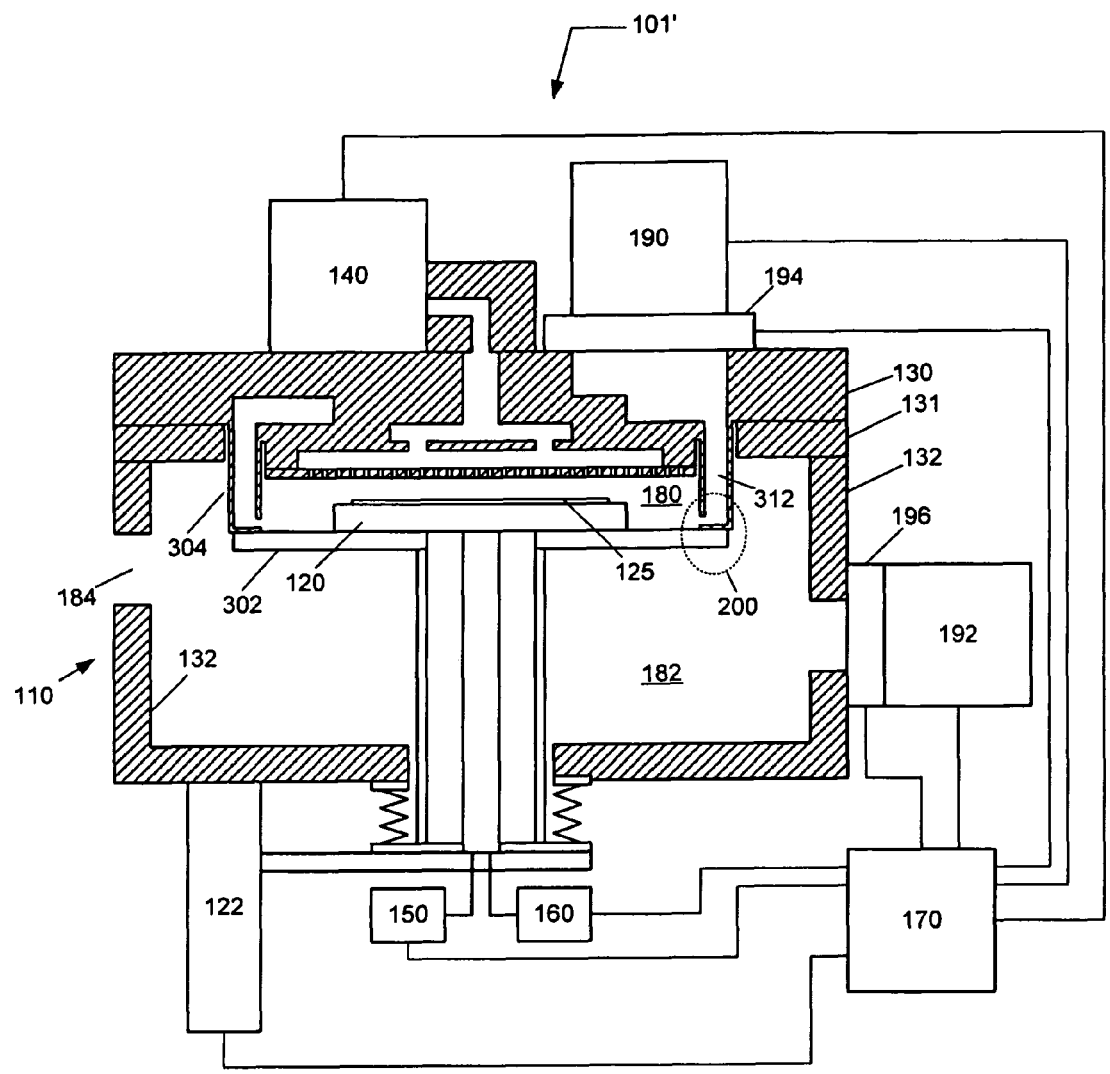
FIG. 1B depicts a schematic view of another deposition system in accordance with one embodiment of the present invention.
Figure 2A:
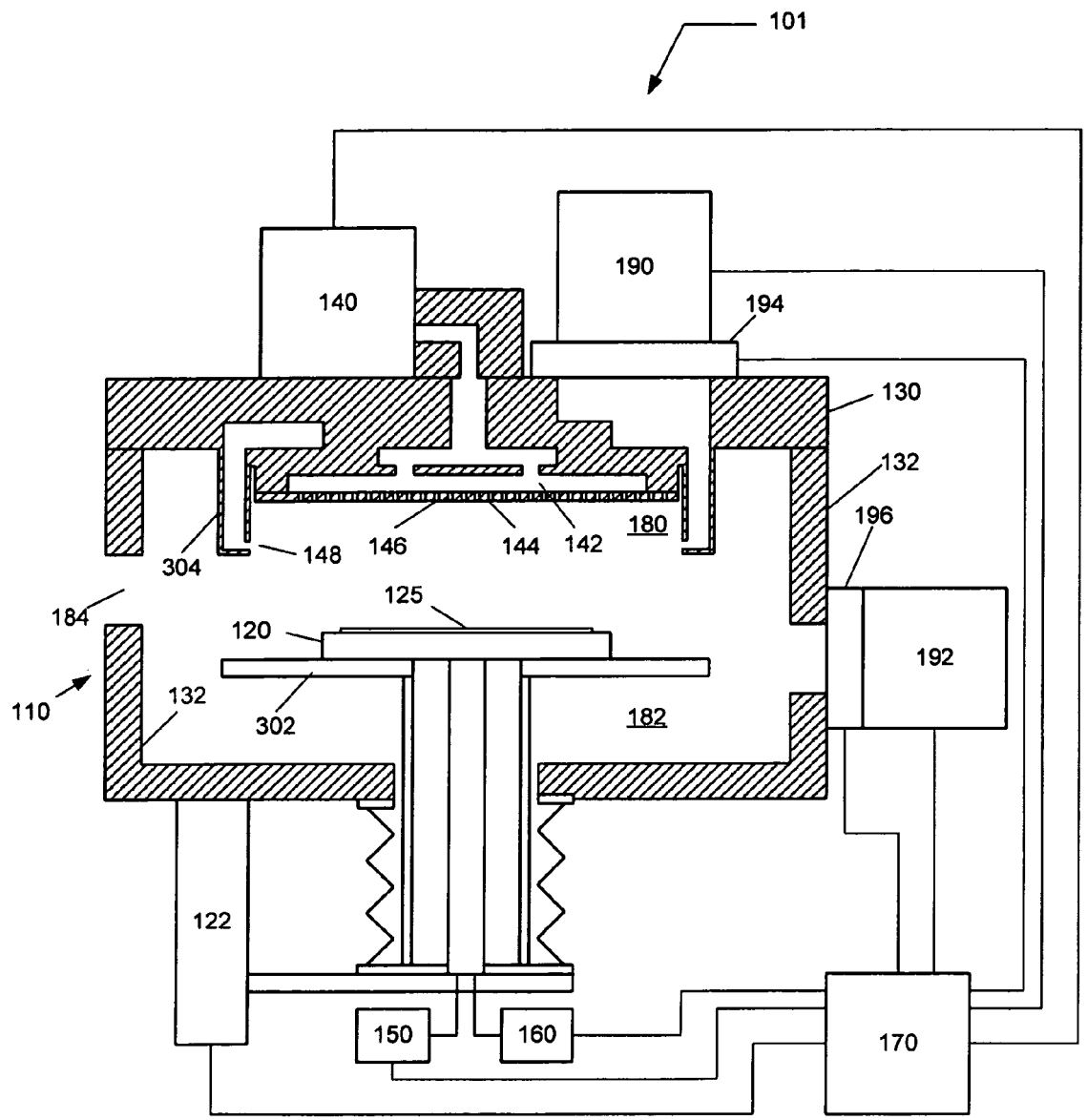
FIG. 2A depicts a schematic view of the deposition system of FIG. 1A in accordance with one embodiment of the present invention in which sample transfer is facilitated at a lower sample stage position.
Figure 2B:
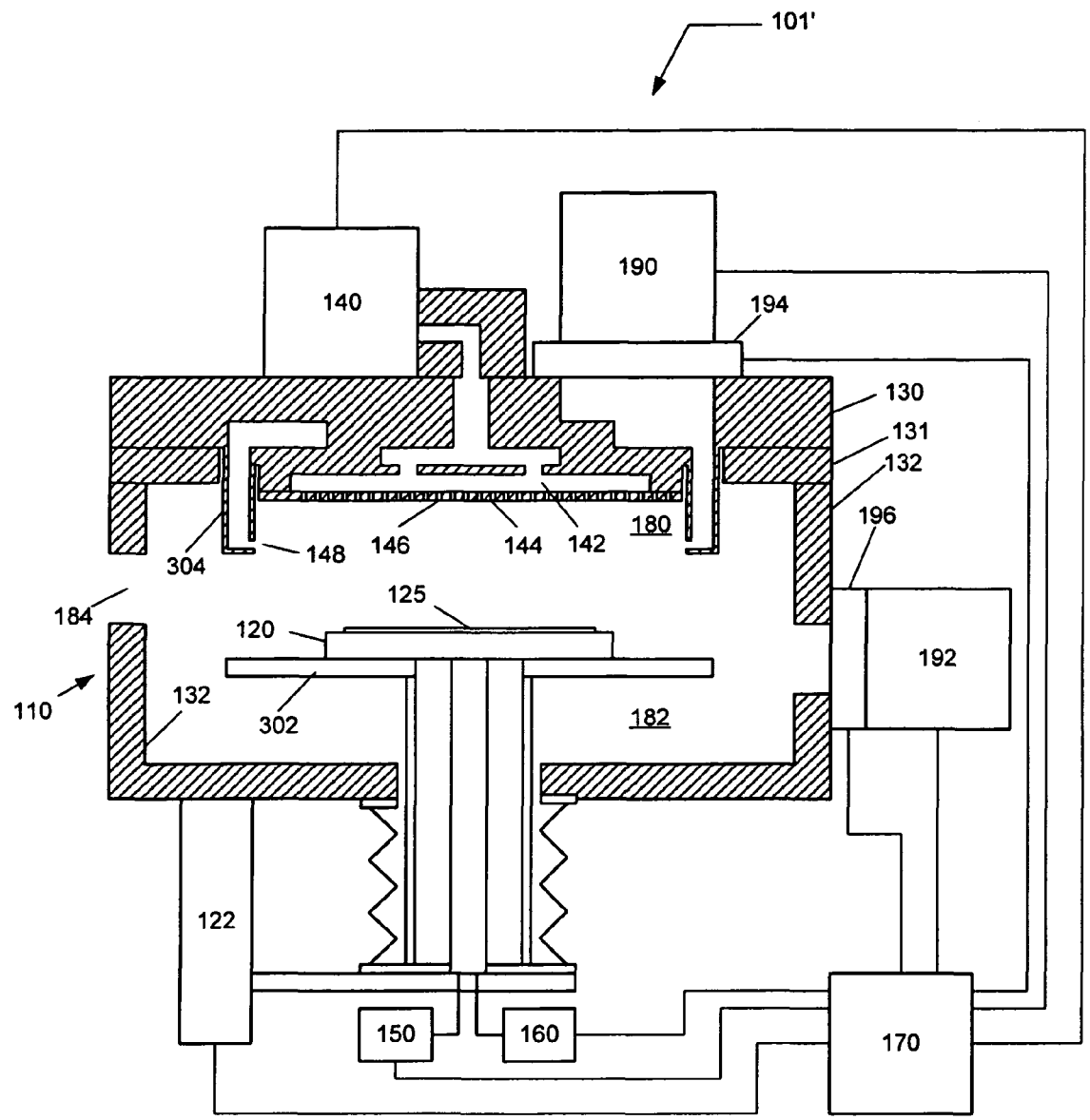
FIG. 2B depicts a schematic view of the deposition system of FIG. 1B in accordance with one embodiment of the present invention in which sample transfer is facilitated at a lower sample stage position.

As shown in FIG. 1A, in one embodiment of the present invention, the deposition system 101 includes a processing chamber 110 having a substrate stage 120 configured to support a substrate 125, upon which a material deposit such as a thin film is formed. The processing chamber 110 further includes an upper chamber assembly 130 configured to define a process space 180 when coupled with substrate stage 120, and a lower chamber assembly 132 configured to define a transfer space 182 with transfer port 184 through which substrate 125 may be placed on the substrate stage 120. Optionally, as shown in FIG. 1B, an intermediate section 131 (i.e., a mid-chamber assembly) can be used in deposition system 101' to connect the upper chamber assembly 130 to the lower chamber assembly 132. Additionally, the deposition system 101 includes a process material supply system 140 configured to introduce a first process material, a second process material, or a purge gas to processing chamber 110. Additionally, the deposition system 101 includes a first power source 150 coupled to the processing chamber 110 and configured to generate plasma in the processing chamber 110, and a substrate temperature control system 160 coupled to substrate stage 120 and configured to elevate and control the temperature of substrate 125. Additionally, the deposition system 101 includes a process volume adjustment system 122 coupled to the processing chamber 110 and the substrate holder 120, and configured to adjust the volume of the process space 180 adjacent substrate 125. For example, the process volume adjustment system 180 can be configured to vertically translate the substrate holder 120 between a first position for processing substrate 125 (see FIGS. 1A and 1B) and a second position for transferring substrate 125 into and out of processing chamber 110 (see FIGS. 2A and 2B).

Furthermore, the deposition system 101 includes a first vacuum pump 190 coupled to process space 180, wherein a first vacuum valve 194 is utilized to control the pumping speed delivered to process space 180. The deposition system 101 includes a second vacuum pump 192 coupled to transfer space 182, wherein a second vacuum valve 196 is utilized to isolate the second vacuum pump 192 from transfer space 182, when necessary.

Further yet, deposition system 101 includes a controller 170 that can be coupled to processing chamber 110, substrate holder 120, upper assembly 130, lower assembly 132, process material supply system 140, first power source 150, substrate temperature control system 160, process volume adjustment system 122, first vacuum pump 190, first vacuum valve 194, second vacuum pump 192, and second vacuum valve 196.

The deposition system 101 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to processing chamber 110, and may be lifted to and from an upper surface of substrate holder 120 via substrate lift system (not shown).

The process material supply system 140 can include a first process material supply system and a second process material supply system which are configured to alternatingly introduce a first process material to processing chamber 110 and a second process material to processing chamber 110. The alternation of the introduction of the first process material and the introduction of the second process material can be cyclical, or it may be acyclical with variable time periods between introduction of the first and second process materials. The first process material can, for example, include a film precursor, such as a composition having the principal atomic or molecular species found in the film formed on substrate 125. For instance, the film precursor can originate as a solid phase, a liquid phase, or a gaseous phase, and may be delivered to processing chamber 110 in a gaseous phase. The second process material can, for example, include a reducing agent. For instance, the reducing agent can originate as a solid phase, a liquid phase, or a gaseous phase, and it may be delivered to processing chamber 110 in a gaseous phase. Examples of gaseous film precursors and reduction gases are given below.

Additionally, the process material supply system 140 can further include a purge gas supply system that can be configured to introduce a purge gas to processing chamber 110 between introduction of the first process material and the second process material to processing chamber 110, respectively. The purge gas can include an inert gas, such as a noble gas (i.e., helium, neon, argon, xenon, krypton), or nitrogen (and nitrogen containing gases), or hydrogen (and hydrogen containing gases).

The process gas supply system 140 can include one or more material sources, one or more pressure control devices, one or more flow control devices, one or more filters, one or more valves, or one or more flow sensors. The process gas supply system 140 can supply one or more process gases to plenum 142, through which gases are dispersed to a plurality of orifices 146 in injection plate 144. The plurality of orifices 146 in injection plate 144 facilitates the distribution of process gases within process space 180. A showerhead design, as known in the art, can be used to uniformly distribute the first and second process gas materials into the process space 180. Exemplary showerheads are described in greater detail in U.S. Ser. No. 11/090,255 and in pending U.S. Patent Application Pub. No. 20040123803, Ser. No. 10/469592, the entire contents of each of which are incorporated herein by reference in their entirety.

Referring back to FIG. 1A, deposition system 101 can be configured to perform a thermal deposition process (i.e., a deposition process not utilizing a plasma), such as a thermal atomic layer deposition (ALD) process or a thermal chemical vapor deposition (CVD) process. Alternatively, deposition system 101 can be configured for a plasma enhanced deposition process in which either of the first process material or the second process material can be plasma activated. The plasma enhanced deposition process can include a plasma enhanced ALD (PEALD) process, or it may include a plasma enhanced CVD (PECVD) process.

In a PEALD process, a first process material, such as a film precursor, and a second process material, such as a reduction gas, are sequentially and alternatingly introduced to form a thin film on a substrate. For example, when preparing a tantalum-containing film using a PEALD process, the film precursor can comprise a metal halide (e.g., tantalum pentachloride), or a metal organic (e.g., $Ta(NC(CH_3)_2C_2H_5)(N(CH_3)_2)_3$; hereinafter referred to as TAIMATA®; for additional details, see U.S. Pat. No. 6,593,484). In this example, the reduction gas can include hydrogen, ammonia ($NH_3$), $N_2$ and $H_2$, $N_2H_4$, $NH(CH_3)_2$, or $N_2H_3CH_3$, or any combination thereof.

The film precursor is introduced to processing chamber 110 for a first period of time in order to cause adsorption of the film precursor on exposed surfaces of substrate 125. Preferably, a monolayer adsorption of material occurs. Thereafter, the processing chamber 110 is purged with a purge gas for a second period of time. After adsorbing film precursor on substrate 125, a reduction gas is introduced to processing chamber 110 for a third period of time, while power is coupled through, for example, the upper assembly 130 from the first power source 150 to the reduction gas. The coupling of power to the reduction gas heats the reduction gas, thus causing ionization and dissociation of the reducing gas in order to form, for example, dissociated species such as atomic hydrogen which can react with the adsorbed Ta film precursor to reduce the adsorbed Ta film precursor to form the desired Ta containing film. This cycle can be repeated until a Ta containing layer of sufficient thickness is produced.

As shown in FIG. 1A, the process space 180 is separated from the transfer space 182 by the substrate stage 120, a flange 302 on the substrate stage 120, and an extension 304 from the upper chamber assembly 130. As such, there can be a sealing mechanism at the base of the extension 304 to seal or at least impede gas flow between the process space and the transfer space (to be discussed in detail later). Thus, surfaces of the process space 180 can be maintained at an elevated temperature to prevent accumulation of process residues on surfaces surrounding that space, while surfaces of the transfer space can be maintained at a reduced temperature to reduce contamination of the lower assembly 132 (including sidewalls) and the intermediate section 131 and the upper assembly 132.

In this regard separation of the process space from the transfer space, in one embodiment of the present invention, involves thermal separation of the elevated upper chamber assembly 130 from the reduced temperature lower chamber assembly 132. For thermal separation, the extension 304 can function as a radiation shield. Moreover, the extension 304 including an interior channel 312 can function as a thermal impedance limiting the heat flow across the extension element into the transfer space 182 surrounding the extension 304.

In another example of thermal separation, a cooling channel can be provided in the upper chamber assembly 130 near the lower chamber assembly 132 as shown in FIG. 1A, or near the intermediate section 131 as shown in FIG. 1B, or can be provided in the intermediate section 131. Further, the thermal conductivity of the materials for the upper chamber assembly 130 and the intermediate section 131 can be different. For example, the upper chamber assembly 130 can be made of aluminum or an aluminum alloy, and the intermediate section 131 can be made of stainless steel. The lower chamber assembly 132 can be made of aluminum or an aluminum alloy.

In one example, a vapor deposition process can be used be to deposit tantalum (Ta), tantalum carbide, tantalum nitride, or tantalum carbonitride in which a Ta film precursor such as $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$, adsorbs to the surface of the substrate followed by exposure to a reduction gas or plasma such as $H_2$, $NH_3$, $N_2$ and $H_2$, $N_2H_4$, $NH(CH_3)_2$, or $N_2H_3CH_3$.

In another example, titanium (Ti), titanium nitride, or titanium carbonitride can be deposited using a Ti precursor such as $TiF_4$, $TiCl_4$, $TiBr_4$, $TiI_4$, $Ti[N(C_2H_5CH_3)]_4$ (TEMAT), $Ti[N(CH_3)_2]_4$(TDMAT), or $Ti[N(C_2H_5)_2]_4$(TDEAT), and a reduction gas or plasma including $H_2$, $NH_3$, $N_2$ and $H_2$, $N_2H_4$, $NH(CH_3)_2$, or $N_2H_3CH_3$.

As another example, tungsten (W), tungsten nitride, or tungsten carbonitride can be deposited using a W precursor such as $WF_6$, or $W(CO)_6$, and a reduction gas or plasma including $H_2$, $NH_3$, $N_2$ and $H_2$, $N_2H_4$, $NH(CH_3)_2$, or $N_2H_3CH_3$.

In another example, molybdenum (Mo) can be deposited using a Mo precursor such as molybdenum hexafluoride ($MoF_6$), and a reduction gas or plasma including $H_2$.

In another example, Cu can be deposited using a Cu precursor having Cu-containing organometallic compounds, such as Cu(TMVS)(hfac), also known by the trade name CupraSelect®, available from Schumacher, a unit of Air Products and Chemicals, Inc., 1969 Palomar Oaks Way, Carlsbad, Calif. 92009), or inorganic compounds, such as CuCl. The reduction gas or plasma can include at least one of $H_2$, $O_2$, $N_2$, $NH_3$, or $H_2O$. As used herein, the term "at least one of A, B, C, . . . or X" refers to any one of the listed elements or any combination of more than one of the listed elements.

In another example of a vapor deposition process, when depositing zirconium oxide, the Zr precursor can include $Zr(NO_3)_4$, or $ZrCl_4$, and the reduction gas can include $H_2O$.

When depositing hafnium oxide, the Hf precursor can include $Hf(OBu^t)_4$, $Hf(NO_3)_4$, or $HfCl_4$, and the reduction gas can include $H_2O$. In another example, when depositing hafnium (Hf), the Hf precursor can include $HfCl_4$, and the second process material can include $H_2$.

When depositing niobium (Nb), the Nb precursor can include niobium pentachloride ($NbCl_5$), and the reduction gas can include $H_2$.

When depositing zinc (Zn), the Zn precursor can include zinc dichloride ($ZnCl_2$), and the reduction gas can include $H_2$.

When depositing silicon oxide, the Si precursor can include $Si(OC_2H_5)_4$, $SiH_2Cl_2$, $SiCl_4$, or $Si(NO_3)_4$, and the reduction gas can include $H_2O$ or $O_2$. In another example, when depositing silicon nitride, the Si precursor can include $SiCl_4$, or $SiH_2Cl_2$, and the reduction gas can include $NH_3$, or $N_2$ and $H_2$. In another example, when depositing TiN, the Ti precursor can include titanium nitrate ($Ti(NO_3)$), and the reduction gas can include $NH_3$.

In another example of a vapor deposition process, when depositing aluminum, the Al precursor can include aluminum chloride ($Al_2Cl_6$), or trimethylaluminum ($Al(CH_3)_3$), and the reduction gas can include $H_2$. When depositing aluminum nitride, the Al precursor can include aluminum trichloride, or trimethylaluminum, and the reduction gas can include $NH_3$, or $N_2$ and $H_2$. In another example, when depositing aluminum oxide, the Al precursor can include aluminum chloride, or trimethylaluminum, and the reduction gas can include $H_2O$, or $O_2$ and $H_2$.

In another example of a vapor deposition process, when depositing GaN, the Ga precursor can include gallium nitrate ($Ga(NO_3)_3$), or trimethylgallium ($Ga(CH_3)_3$), and the reduction gas can include $NH_3$.

In the examples given above for forming various material layers, the process material deposited can include at least one of a metal film, a metal nitride film, a metal carbonitride film, a metal oxide film, or a metal silicate film. For example, the process material deposited can include at least one of a tantalum film, a tantalum nitride film, or a tantalum carbonitride film. Alternatively, for example, the process material deposited can include for example an Al film, or a Cu film deposited to metallize a via for connecting one metal line to another metal line or for connecting a metal line to source/drain contacts of a semiconductor device. The Al or Cu films can be formed with or without a plasma process using precursors for the Al and Cu as described above. Alternatively, for example, the process material deposited can include a zirconium oxide film, a hafnium oxide film, a hafnium silicate film, a silicon oxide film, a silicon nitride film, a titanium nitride film, and/or a GaN film deposited to form an insulating layer such as for example above for a metal line or a gate structure of a semiconductor device.

Further, silane and disilane could be used as silicon precursors for the deposition of silicon-based or silicon-including films. Germane could be used a germanium precursor for the deposition of germanium-based or germanium-including films. As such, the process material deposited can include a metal silicide film and/or a germanium-including film deposited for example to form a conductive gate structure for a semiconductor device.

Referring still to FIG. 1A, the deposition system 101 can include a plasma generation system configured to generate a plasma during at least a portion of the alternating introduction of the first process material and the second process material to processing chamber 110. The plasma generation system can include the first power source 150 coupled to the processing chamber 110, and configured to couple power to the first process material, or the second process material, or both in processing chamber 110. The first power source 150 may include a radio frequency (RF) generator and an impedance match network (not shown), and may further include an electrode (not shown) through which RF power is coupled to plasma in processing chamber 110. The electrode can be formed in the substrate stage 120, or may be formed in the upper assembly 130 and can be configured to oppose the substrate stage 120. The substrate stage 120 can be electrically biased with a DC voltage or at an RF voltage via the transmission of RF power from an RF generator (not shown) through an impedance match network (not shown) to substrate stage 120.

The impedance match network can be configured to optimize the transfer of RF power from the RF generator to the plasma by matching the output impedance of the match network with the input impedance of the processing chamber, including the electrode, and plasma. For instance, the impedance match network serves to improve the transfer of RF power to plasma in plasma processing chamber 110 by reducing the reflected power. Match network topologies (e.g. L-type, π-type, T-type, etc.) and automatic control methods are well known to those skilled in the art. A typical frequency for the RF power can range from about 0.1 MHz to about 100 MHz. Alternatively, the RF frequency can, for example, range from approximately 400 kHz to approximately 60 MHz, By way of further example, the RF frequency can, for example, be approximately 13.56 or 27.12 MHz.

Still referring to FIG. 1A, deposition system 101 includes substrate temperature control system 160 coupled to the substrate stage 120 and configured to elevate and control the temperature of substrate 125. Substrate temperature control system 160 includes temperature control elements, such as a cooling system including a re-circulating coolant flow that receives heat from substrate stage 120 and transfers heat to a heat exchanger system (not shown), or when heating, transfers heat from the heat exchanger system. Additionally, the temperature control elements can include heating/cooling elements, such as resistive heating elements, or thermoelectric heaters/coolers can be included in the substrate holder 120, as well as the chamber wall of the processing chamber 110 and any other component within the deposition system 101.

In order to improve the thermal transfer between substrate 125 and substrate stage 120, substrate stage 120 can include a mechanical clamping system, or an electrical clamping system, such as an electrostatic clamping system, to affix substrate 125 to an upper surface of substrate stage 120. Furthermore, substrate holder 120 can further include a substrate backside gas delivery system configured to introduce gas to the backside of substrate 125 in order to improve the gas-gap thermal conductance between substrate 125 and substrate stage 120. Such a system can be utilized when temperature control of the substrate is required at elevated or reduced temperatures. For example, the substrate backside gas system can include a two-zone gas distribution system, wherein the helium gas gap pressure can be independently varied between the center and the edge of substrate 125.

Furthermore, the processing chamber 110 is further coupled to the first vacuum pump 190 and the second vacuum pump 192. The first vacuum pump 190 can include a turbo-molecular pump, and the second vacuum pump 192 can include a cryogenic pump.

The first vacuum pump 190 can include a turbo-molecular vacuum pump (TMP) capable of a pumping speed up to about 5000 liters per second (and greater) and valve 194 can include a gate valve for throttling the chamber pressure. In conventional plasma processing devices utilized for dry plasma etch, a 1000 to 3000 liter per second TMP is generally employed. Moreover, a device for monitoring chamber pressure (not shown) can be coupled to the processing chamber 110. The pressure measuring device can be, for example, a Type 628B Baratron absolute capacitance manometer commercially available from MKS Instruments, Inc. (Andover, Mass).

As shown in FIGS. 1A, 1B, 2A and 2B, the first vacuum pump 190 can be coupled to process space 180 such that it is located above the plane of substrate 125. However, the first vacuum pump 190 can be configured to access process space 180 such that it pumps process space 180 from a location below the plane of substrate 125 in order to, for example, reduce particle contamination. It should be noted, other locations for the first vacuum pump 190 are contemplated. The fluid coupling between the location of pumping from process space 180 and the inlet to the first vacuum pump 190 can be designed for maximal flow conductance. Alternately, the fluid coupling between the location of pumping from process space 180 and the inlet to the first vacuum pump 190 can be designed for a substantially constant cross-sectional area.

In one embodiment, the first vacuum pump 190 is located above the upper chamber assembly 130 and is coupled to an upper surface thereof (see FIG. 1A). The inlet 191 of the first vacuum pump 190 is coupled to at least one annular volume, such as a pumping channel 312, which is coupled through extension 304 to one or more openings 305 that access process space 180 at a location below the plane of substrate 125. The one or more openings 305 may comprise one or more slots, one or more orifices, or any combination thereof.

In another embodiment, the first vacuum pump 190 is located above the upper chamber assembly 130 and is coupled to an upper surface thereof (see FIG. 1A). The inlet 191 of the first vacuum pump 190 is coupled to a first annular volume that is in turn coupled to a second annular volume, whereby the first annular volume and the second annular volume are coupled via one or more pumping ports. The second annular volume can be coupled to pumping channel 312, which is coupled through extension 304 to one or more openings 305 that access process space 180 at a location below the plane of substrate 125. For example, the one or more pumping ports may comprise two through-holes diametrically opposing one another (i.e., 180 degrees apart) between the first annular volume and the second annular volume. However, the number of pumping ports may be more or less, and their location may vary. Additionally, for example, the one or more openings 305 may comprise two slots diametrically opposing one another (i.e., 180 degrees apart). Furthermore, each slot can extend approximately 120 degrees in the azimuthal direction. However, the number of openings 305 may be more or less, and their location and size may vary.

Figure 3:
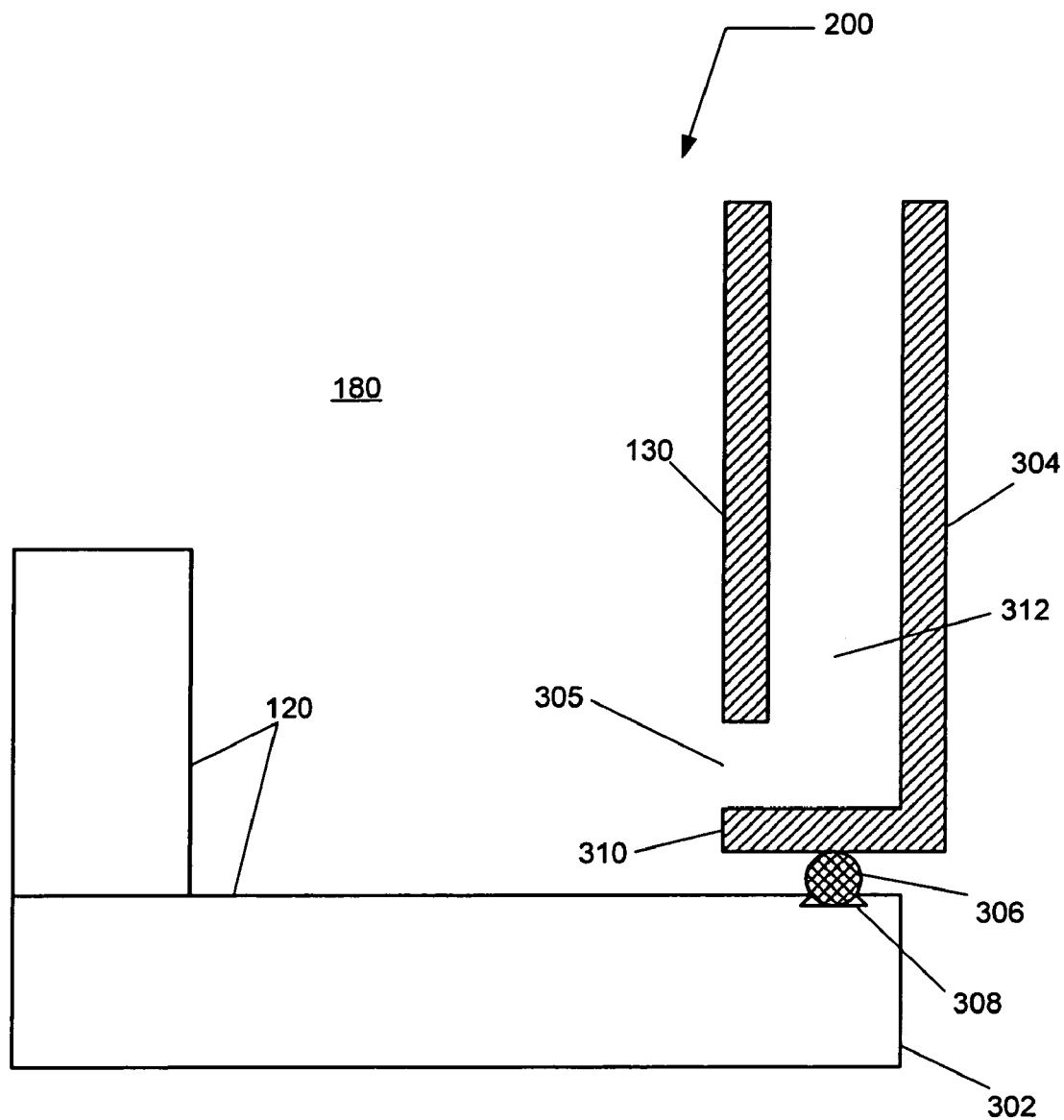
FIG. 3 depicts a schematic view of a sealing mechanism.

As noted above, it is desirable to be able to provide vacuum isolation between the process space 180 and the transfer space 182, or at least impede the flow of gases between the process space 180 and the transfer space 182 during processing. FIG. 3 depicts the detail area 200 (shown in FIGS. 1A and 1B) and illustrates one method for providing vacuum isolation between process space 180 and the transfer space 182 by providing a sealing device between the substrate stage 120 and the upper assembly 130 when the deposition system 101 is in a processing configuration. As such, the system includes a sealing member that impedes the flow of gas between the process space and the transfer space. Indeed, in one embodiment, a seal of the sealing member separates the vacuum environment of the process space from the vacuum environment of the transfer space. By vacuum separating the process space from the transfer space, the seal is able to reduce leakage between the process space and the transfer space to less than $10^{-3}$ Torr-l/s and preferably less than $10^{-4}$ Torr-l/s.

FIG. 3 is a schematic diagram illustrating a seal configuration for producing a seal between a flange 302 of the substrate stage 120 and an extension 304 from the upper chamber assembly 130. As shown in FIG. 3, a seal 306 is located in a groove 308 of the flange 302 of the substrate stage 120. Details of the seal 306 will be described below. As illustrated in FIG. 3, the seal 306 contacts a bottom plate 310 (i.e., a seal plate) of the extension 304. A pumping channel 312 is provided in the extension 304 for the purpose of evacuating gases from processing region 180 to pump 190. The configuration shown in FIG. 3 provides an adequate seal; however, the present inventors have recognized that during the release of the seal following substrate processing, the seal 306 has a tendency to stick. After repeated use, i.e., engaging the seal during processing and disengaging the seal during substrate transfer, this occasional or persistent "sticking" of the seal can cause damage to the seal and thereby lead to poor vacuum isolation between the process space and the transfer space and increased contamination. Moreover, the difference in temperature between the substrate stage 120 and the upper chamber assembly 130 can exacerbate the demise of seal 306.

Figure 4:
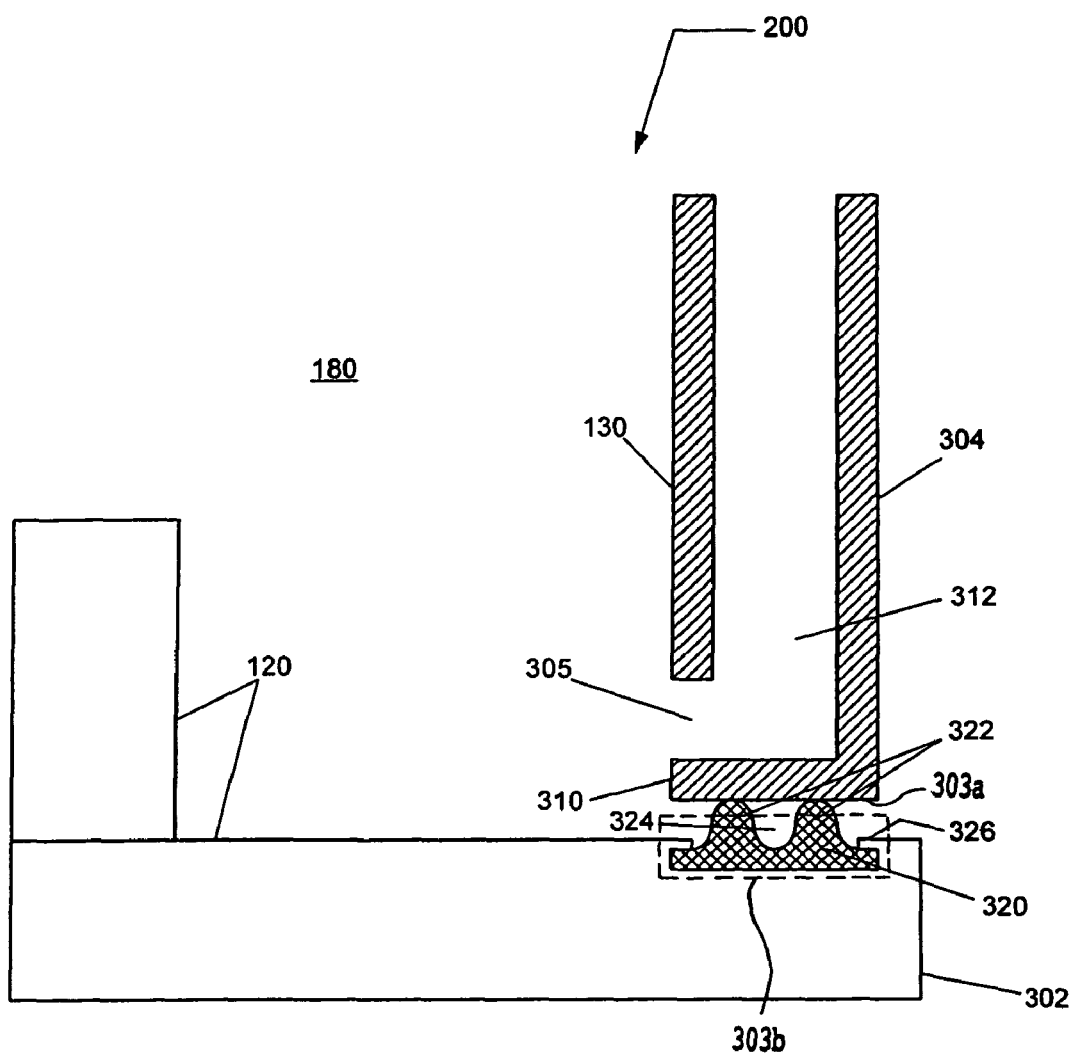
FIG. 4 depicts a schematic view of a sealing mechanism in accordance with one embodiment of the present invention.

Referring now to FIG. 4, according to one embodiment of the invention, a seal configuration for producing a seal between a first sealing surface on a first chamber assembly and a second sealing surface on a second chamber assembly, while improving the release of the seal following processing, is illustrated. For example, the first sealing surface on the first chamber assembly can include first sealing surface 303a on extension 304 from the upper chamber assembly 130. The second sealing surface on the second chamber assembly can include second sealing surface 303b on flange 302 of the substrate stage 120. A dual-contact seal 320 is presented comprising two contact ridges 322 and a trough or pocket 324 disposed therebetween. The dual-contact seal 320 is coupled to the second sealing surface 303b, and it is retained on flange 302 by a confinement lip 326 that is formed in the second sealing surface 303b of flange 302 on both sides of seal 320. One benefit of placing the dual-contact seal 320 on the second sealing surface 303b rather than the first sealing surface 303a is that the second sealing surface may be easier to access, therefore, a seal located on the second surface can be more easily replaced than if located in other parts of the chamber. Additionally, if the substrate stage 120 is removed from the processing chamber 110, the dual contact seal 320 may be examined and/or replaced conveniently in an area outside the processing chamber. However, it is noted that the dual-contact seal 320 (or other sealing device described such as a tri-contact seal 330 described later) may be placed on the first sealing surface 303a instead of on the second sealing surface 303b. Beneficial effects of positioning the seal on the first sealing surface 303a result from that fact that the first sealing surface 303a usually is disposed in the top part of the processing chamber 110. Therefore, placing the dual-contact seal 320 (or other such seal) on the first sealing surface diminishes the accumulation of particles in any pocket or trough area 324 formed by the dual-contact seal 320 because the pocket 324 is oriented to be open downward. Further, the first sealing surface is typically more stationary than the second sealing surface. Accordingly any particulate that is deposited on the seal device is less likely to be stirred. For example, when the substrate stage 120 translates from one position to another, a seal on the first sealing surface 303a need not move, and therefore, should generate less contamination in the processing chamber 110. It is further noted that the terms "first" and "second" are merely names of the particular embodiments described and are not intended to be definitions of terms used in the claims. For example, the term "first" sealing surface may refer to either of the components 303a or 303b as shown in the figures. Likewise, the "second" sealing surface may also refer to either component.

During substrate transfer or prior to substrate processing, the process space 180 is open to the transfer space 182. Either the process space 180 or transfer space 182 or both may be evacuated, purged with gas, such as an inert gas, or both. For example, the pressure within process space 180 and transfer space 182 may be a vacuum pressure; however, it may be elevated to a value greater than the pressure in process space 180 during substrate processing. Once the substrate stage 120 translates vertically to engage the seal 320 with extension 304, high pressure gas, such as inert gas, is trapped in pocket 324. In this embodiment, the gas trapped in pocket 324 is at a pressure greater than the respective pressures in the process space 180 and the transfer space 182 once the seal is engaged. For example, the pressure of the trapped gas may be higher due to the partial compression of seal 320 upon formation of the vacuum seal or due to lowering of the respective pressures in process space 180 and transfer space 182 following the formation of the vacuum seal or heating of the trapped gas or any combination thereof, to name a few reasons. This high pressure in the pocket can impede gas flow from the transfer space to the process space. For example, at some times, the gas in the pocket may be different than a gas in the transfer space. Accordingly, the gas in the pocket helps prevent gas from the transfer space from contaminating the process space. Further, during the lowering of substrate stage 120, the high pressure gas trapped in pocket 324 can assist in the release of seal 320 without detriment to the seal. For example, pressurized gas inside the pocket 324 will push outward once the force on the seal 320 due to compression is reduced. Thus, some lateral force is applied to the seal 320 causing it to break contact with the second sealing surface 303b. Furthermore, gas escaping from the pocket 324 can tend to shear through points of adhesion between the two contact ridges 322 and the second sealing surface 303b.

Figure 5:
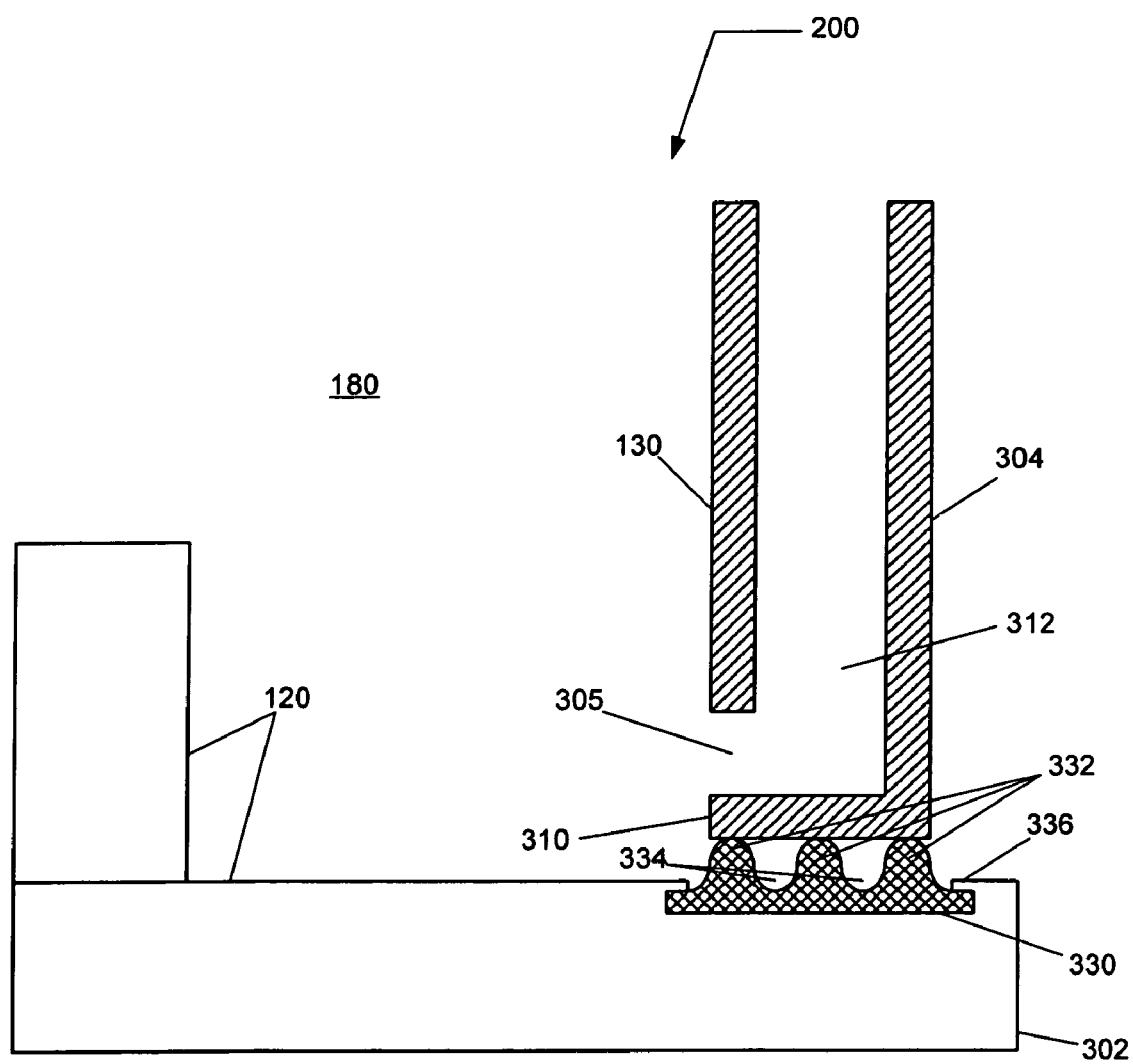
FIG. 5 depicts a schematic view of another sealing mechanism in accordance with one embodiment of the present invention.

Referring now to FIG. 5, according to another embodiment of the invention, a seal configuration for producing a seal between a flange 302 of the substrate stage 120 and an extension 304 from the upper chamber assembly 130, while improving the release of the seal following processing, is illustrated. A tri-contact seal 330 is presented comprising three contact ridges 332 and a dual-pocket 334 disposed therebetween. A confinement lip 336 can be formed in flange 302 on both sides of seal 306 in order to retain seal 330 on flange 302. One possible benefit of having a dual-pocket 334 is that the three contact ridges 332 can provide a graduated pressure differential between the process space 180 and the transfer space 182. For example, the pressure inside the pocket adjacent to the transfer space 182 may have a greater pressure than the pocket next to the process space 180. This may be due to unavoidable leakage from the relatively high pressure transfer space or due to seal design such as higher contact ridges that cause more compression of the gas in one pocket relative to another pocket. As leakage will be proportional to the pressure differential across a given seal, the leakage from the pocket adjacent the process space into the process space 180 is less than if this pocket were itself adjacent to relatively higher pressure transfer space. As the pressure is often different inside each of the pockets, the mechanism by which the gas "shears" the contact between the seal and the second sealing surface 303b occurs with the tri-contact seal 330 as it does with the dual-contact seal 320. Thus, each of the three contact ridges 332 will sever contact with the second sealing surface 303b similarly to the method by which the two contact ridges 332 of the dual-contact seal 320 sever contact.

During substrate transfer or prior to substrate processing, the process space 180 is open to the transfer space 182. Either the process space 180 or transfer space 182 or both may be purged with gas, such as an inert gas, and the pressure within process space 180 and transfer space 182 may be elevated to a value greater than the pressure in process space 180 during substrate processing. Once the substrate stage 120 translates vertically to engage the seal 330 with extension 304, high pressure, inert gas is trapped in dual-pocket 334. During the lowering of substrate stage 120, the high pressure inert gas trapped in dual-pocket 334 can assist in the release of seal 330 without detriment to the seal.

Seals 320 and 330 can be fabricated from an elastomeric material, such as Viton or Kalrez. Regarding the dimensions for the seals, the height may, for example, range from approximately 1 mm to approximately 10 mm, and desirably the height may, for example, range from approximately 2 mm to approximately 5 mm. With regards to the lateral dimensions, the width can, for example, range from approximately 1 mm to approximately 20 mm, and desirably the width can range from approximately 2 mm to approximately 10 mm.

Figure 6:
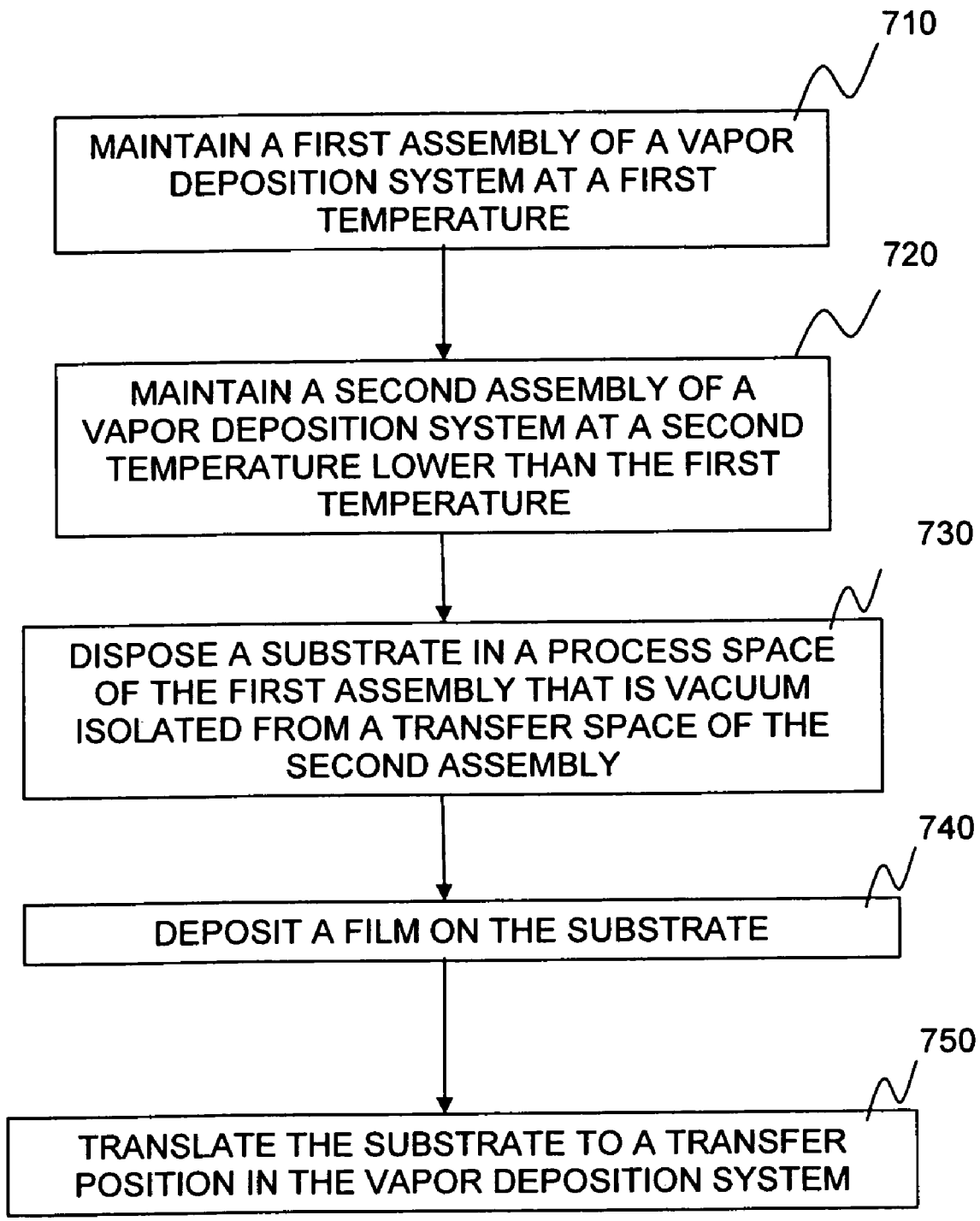
FIG. 6 shows a process flow diagram of a process in accordance with one embodiment of the present invention.

FIG. 6 shows a process flow diagram of a process in accordance with one embodiment of the present invention. The process of FIG. 6 may be performed by the processing system of FIGS. 1-2, or any other suitable processing system. As seen in FIG. 6, in step 710, the process includes disposing a substrate in a process space of a processing system that is vacuum isolated from a transfer space of the processing system. In step 720, a substrate is processed at either of a first position or a second position in the process space while maintaining vacuum isolation from the transfer space. In step 730, a material is deposited on the substrate at either the first position or the second position.

In steps 710-730, the first assembly can be maintained greater than or equal to 100 degrees C., while the second assembly can be maintained less than or equal to 100 degrees C. In steps 710-730, the first assembly can be maintained greater than or equal to 50 degrees C., while the second assembly can be maintained less than or equal to 50 degrees C. In steps 710-730, the gas conductance from the process space to the transfer space to less than $10^{-3}$ Torr-l/s, and preferably less than $10^{-4}$ Torr-l/s.

In step 730, in order to deposit a material, a process gas composition can be introduced to the process for vapor deposition of the material. Further, plasma can be formed from the process gas composition to enhance the vapor deposition rate.

In step 730, the material deposited can be at least one of a metal, metal oxide, metal nitride, metal carbonitride, or a metal silicide. For example, the material deposited can be at least one of a tantalum film, a tantalum nitride film, or a tantalum carbonitride film.

The processing system can be configured for at least one of an atomic layer deposition (ALD) process, a plasma enhanced ALD (PEALD) process, a chemical vapor deposition (CVD) process, or a plasma enhanced CVD (PECVD) process.

In step 730, plasma can be formed by applying radio frequency (RF) energy at a frequency from 0.1 to 100 MHz to a process gas in the process space. During step 730, an electrode can be connected to a RF power supply and configured to couple the RF energy into the process space.

Furthermore, a purge gas can be introduced after depositing the material. Moreover, with or without the purge gas present, electromagnetic power can be coupled to the vapor deposition system to release contaminants from at least one of the vapor deposition system or the substrate. The electromagnetic power can be coupled into the vapor deposition system in the form of a plasma, an ultraviolet light, or a laser.

Still referring to FIG. 1A, controller 170 can include a microprocessor, memory, and a digital I/O port capable of generating control voltages sufficient to communicate and activate inputs to deposition system 101 as well as monitor outputs from deposition system 101. Moreover, the controller 170 may exchange information with the processing chamber 110, substrate stage 120, upper assembly 130, lower chamber assembly 132, process material supply system 140, first power source 150, substrate temperature control system 160, first vacuum pump 190, first vacuum valve 194, second vacuum pump 192, second vacuum valve 196, and process volume adjustment system 122. For example, a program stored in the memory may be utilized to activate the inputs to the aforementioned components of the deposition system 101 according to a process recipe in order to perform an etching process, or a deposition process.

The controller 170 can include a microprocessor, memory, and a digital I/O port capable of generating control voltages sufficient to communicate and activate inputs to deposition system 101 (101') as well as monitor outputs from deposition system 101 (101') in order to control and monitor the above-discussed processes for material deposition. For example, the controller 170 can include computer readable medium containing program instructions for execution to accomplish the steps described above in relation to FIG. 6. Moreover, the controller 170 may be coupled to and may exchange information with the process chamber 110, substrate stage 120, upper assembly 130, process material gas supply system 140, power source 150, substrate temperature controller 160, first vacuum pumping system 190, and/or second vacuum pumping system 192. For example, a program stored in the memory may be utilized to activate the inputs to the aforementioned components of the deposition system 101 (101') according to a process recipe in order to perform one of the above-described non-plasma or plasma enhanced deposition processes.

One example of the controller 170 is a DELL PRECISION WORKSTATION 610™, available from Dell Corporation, Austin, Tex. However, the controller 170 may be implemented as a general-purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 170 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 170, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 170 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 170.

The controller 170 may be locally located relative to the deposition system 101 (101'), or it may be remotely located relative to the deposition system 101. For example, the controller 170 may exchange data with the deposition system 101 using at least one of a direct connection, an intranet, the Internet and a wireless connection. The controller 170 may be coupled to an intranet at, for example, a customer site (i.e., a device maker, etc.), or it may be coupled to an intranet at, for example, a vendor site (i.e., an equipment manufacturer). Additionally, for example, the controller 170 may be coupled to the Internet. Furthermore, another computer (i.e., controller, server, etc.) may access, for example, the controller 170 to exchange data via at least one of a direct connection, an intranet, and the Internet. As also would be appreciated by those skilled in the art, the controller 170 may exchange data with the deposition system 101 (101') via a wireless connection.

Although only certain exemplary embodiments of inventions have been described in detail above for use with vapor deposition systems, those skilled in the art will readily appreciate that many modifications are possible in the exemplary embodiments without materially departing from the novel teachings and advantages of this invention. For example, the vacuum seal provided between an upper chamber assembly and a lower chamber assembly, or one vacuum chamber component and another vacuum chamber component, as described above, may be utilized in other vacuum processing systems, such as dry etching systems, dry plasma etching systems, etc.

The invention claimed is:

1. A vacuum processing system for treating a substrate, comprising:
   a first chamber assembly comprising a first sealing surface;
   a second chamber assembly comprising a second sealing surface; and
   a sealing device coupled to and retained by one of said first sealing surface or said second sealing surface, said sealing device comprising two or more contact ridges and one or more pockets disposed therebetween,
   wherein a seal between said first chamber assembly and said second chamber assembly is formed by coupling said first chamber assembly to said second chamber assembly in order to facilitate contact of said two or more contact ridges of said sealing device with said second sealing surface while trapping gas between said two or more contact ridges within said pocket,
   wherein the sealing device comprises an elastomeric material that extends continuously from a first of the two or more contact ridges to a second of the two or more contact ridges such that walls of the pocket comprise the elastomeric material.

2. The vacuum processing system of claim 1, wherein said first chamber assembly comprises a process space configured to facilitate material deposition, and said second chamber assembly comprises a transfer space to facilitate transfer of said substrate into and out of said vacuum processing system.

3. The vacuum processing system of claim 2, further comprising:
   a substrate stage connected to said second chamber assembly and configured to support and translate said substrate between a first position in said process space to a second position in said transfer space.

4. The vacuum processing system of claim 3, wherein said sealing device comprises two contact ridges and a pocket formed therebetween.

5. The vacuum processing system of claim 3, wherein said sealing device comprises three contact ridges and two pockets formed therebetween.

6. The vacuum processing system of claim 4, wherein said sealing device is configured to disengage the seal during a translation of the substrate stage from the first position to the second position.

7. The vacuum processing system of claim 4, wherein said sealing device is configured to vacuum isolate the process space from the transfer space.

8. The vacuum processing system of claim 4, wherein said sealing device is configured to reduce gas leakage from said process space to said transfer space to less than $10^{-3}$ Torr-l/s.

9. The vacuum processing system of claim 4, wherein said sealing device is configured to reduce gas leakage from said process space to said transfer space to less than $10^{-4}$ Torr-l/s.

10. The vacuum processing system of claim 3, further comprising:
    a first vacuum pumping system in fluid communication with said process space and configured to provide a reduced contaminant environment in said process space;

a second vacuum pumping system in fluid communication with said transfer space and configured to provide a reduced contaminant environment in said transfer space;

a gas injection system connected to said first chamber assembly, and configured to introduce a process composition to said process space during said material deposition; and a temperature control system coupled to said substrate stage, and configured to control a temperature of said substrate.

11. The vacuum processing system of claim 2, wherein said sealing device is configured to compress trapped gas within the pocket when the first chamber assembly is coupled to the second chamber assembly.

12. The vacuum processing system of claim 11, wherein said first chamber assembly comprises an upper section of said vacuum processing system and said second chamber assembly comprises a lower section of said vacuum processing system; and a substrate stage is configured to translate said substrate in a vertical direction.

13. The vacuum processing system of claim 11, further comprising:

a power source configured to couple power to a process gas composition in said process space to facilitate plasma formation.

14. The vacuum processing system of claim 13, wherein said power source comprises an RF power supply configured to output an RF energy at a frequency from 0.1 to 100 MHz; and said substrate stage includes an electrode connected to said RF power supply and configured to couple said RF energy into said process space.

15. The vacuum processing system of claim 10, wherein said first chamber assembly comprises:

a pumping manifold comprising:

an extension extending from said first chamber assembly to separate the process space from the transfer space, and wherein said extension comprises an internal channel that pneumatically couples said inlet of said vacuum pumping system to one or more openings in said extension beyond a peripheral edge of said substrate and below a surface of said substrate.

16. The vacuum processing system of claim 15, wherein said extension includes an interior channel providing gas conductance from a first side of the extension near said substrate stage to a second side positioned longitudinally at an end of said extension opposite said first side.

17. The vacuum processing system of claim 16, wherein said extension comprises a seal plate having said first sealing surface proximate the first side of said extension.

18. The vacuum processing system of claim 17, wherein said substrate stage comprises:

a flange having said second sealing surface configured to seal to said first sealing surface on said seal plate of the extension through said sealing device upon a translation of said substrate stage toward said first chamber assembly.

19. The vacuum processing system of claim 11, wherein said process space is configured for at least one of atomic layer deposition (ALD) or chemical vapor deposition (CVD).

20. A vacuum processing system for treating a substrate, comprising:

a first chamber assembly comprising a first sealing surface;

a second chamber assembly comprising a second sealing surface; and means for sealing said first chamber assembly to said second chamber assembly such that gas is trapped in said means for sealing when said second chamber assembly translates toward said first assembly and said gas trapped in said means for sealing is at a pressure higher than a pressure external to said means for sealing, wherein the means for sealing includes at least two ridges configured to abut an opposing surface, and the means for sealing comprises an elastomeric material extending continuously from a first of the at least two ridges to a second of the at least two ridges such that a pocket holding the gas trapped in the means for sealing includes walls comprising the elastomeric material.

21. The vacuum processing system of claim 1, wherein the sealing device is retained on one of the first and second sealing surfaces by at least one confinement lip.

22. the vacuum processing system of claim 21, wherein the elastomeric material extends continuously between the first contact ridge, second contact ridge, and a third contact ridge of the sealing device.

23. The vacuum processing system of claim 21, wherein the at least one confinement lip retains a base part of the sealing device, the base part supporting said two or more contact ridges.

24. The vacuum processing system of claim 20, wherein the at least one confinement lip retains a base part of the means for sealing, the base part supporting said two or more contact ridges.

* * * * *